United States Patent [19]
Miyamoto

[11] Patent Number: 5,299,169
[45] Date of Patent: Mar. 29, 1994

[54] MULTIPORT MEMORY DEVICE COMPRISING RANDOM ACCESS PORT AND SERIAL ACCESS PORT

[75] Inventor: Takayuki Miyamoto, Hyogo, Japan

[73] Assignee: Mitsubishi Denki Kabushiki Kaisha, Tokyo, Japan

[21] Appl. No.: 828,262

[22] Filed: Jan. 30, 1992

[30] Foreign Application Priority Data

Jun. 25, 1991 [JP] Japan .................................. 3-152876

[51] Int. Cl.⁵ .............................................. G11C 5/06
[52] U.S. Cl. ................................. 365/230.05; 365/63; 365/51; 365/221
[58] Field of Search ...................... 365/63, 230.05, 51, 365/221

[56] References Cited

U.S. PATENT DOCUMENTS

| | | | |
|---|---|---|---|
| 4,498,155 | 2/1985 | Mohan Rao | 365/189 |
| 4,633,441 | 12/1986 | Ishimoto | 365/189 |
| 4,723,226 | 2/1988 | McDonough et al. | 365/189.02 |
| 4,769,789 | 9/1988 | Noguchi et al. | 365/219 X |
| 4,947,373 | 8/1990 | Yamaguchi et al. | 365/221 X |
| 5,089,993 | 2/1992 | Neal et al. | 365/238.5 X |

OTHER PUBLICATIONS

Nürhmann, "Das Grosse Werkbuch Elektronik", printed in Austria, 1989, pp. 2544-2545.
Meiksin et al., "Electronic Design with Off-the-Shelf Integrated Circuits", Prentice-Hall, Inc. 1984, pp. 367-373.

Primary Examiner—Eugene R. LaRoche
Assistant Examiner—Do Hyum Yoo
Attorney, Agent, or Firm—Lowe, Price, LeBlanc & Becker

[57] ABSTRACT

A dual port memory device capable of random access and serial access, having a random data input/output port arranged along a power supply wiring formed along one direction with respect to a power supply terminal, and a serial data input/output port arranged along a power supply wiring formed along the other direction with respect to the power supply terminal. Noise can be prevented from being included in a random data at an L level in inverting a serial data.

4 Claims, 9 Drawing Sheets ns
MULTIPORT MEMORY DEVICE COMPRISING RANDOM ACCESS PORT AND SERIAL ACCESS PORT

BACKGROUND OF THE INVENTION

1. Field of the Invention

The present invention relates to a dual port memory device capable of accessing in random and in series a plurality of memory cells in a memory cell array, and more particularly, to an improvement of the arrangement of a data input/output port.

2. Description of the Background Art

In accordance with the development of recent image processing techniques, technical development of three dimensional display of color displays of CRTs for personal computers and CAD systems, and for enlarging/reducing images and multiwindows for screens are in progress.

Various port memory devices have been developed for storing digital video signals under such circumstances. A dual port memory device is known as a random access memory optimized for storing video data, and is capable of random and serial access.

FIG. 5 is a diagram showing the pin connection of such a 4-bit dual port memory device. Referring to FIG. 5, the dual port memory device is separated into two groups, one which is enclosed by the chain dotted line, and the other of the remaining pins. The pins separated by the chain dotted line are used for serial access, and the remaining pins are used for random access. A conventional DRAM is supplied with a port for serial access. This dual port memory comprises the following terminals. The reference characters of the terminals and the signals are identical.

Address terminals $A_0$–$A_7$ receive address signals $A_0$–$A_7$.

A control terminal $\overline{RAS}$ receives a row address strobe signal $\overline{RAS}$.

A control terminal $\overline{CAS}$ receives a column address strobe signal $\overline{CAS}$.

Control terminals $\overline{WB}/\overline{WE}$ receive in a time divisional manner a write enable signal $\overline{WE}$ and a signal $\overline{WB}$ for specifying write per bit operation. This write per bit operation inhibits writing to a desired bit out of the input data of a plural bit unit.

Control terminals $\overline{DT}/\overline{OE}$ receive signals $\overline{DT}/\overline{OE}$ for data output of a random data input/output port, and for data transfer between a data register and a memory cell array.

A control terminal SC receives a clock signal SC for controlling the input/output of serial data.

A control terminal $\overline{SE}$ receives a serial enable signal $\overline{SE}$.

Random data input/output terminals $W_0/IO_0$–$W_3/IO_3$ receive externally applied data of 4 bits $W_0$–$W_3$, as well as data $IO_0$–$IO_3$ read out from 4 bits of memory cells in a memory cell array.

Serial data input/output terminals $SIO_0$–$SIO_3$ receive externally applied data, as well as data read out in series from a memory cell array.

Power supply terminals $V_{ss}$ and $V_{CC}$ receive externally applied power supply voltage.

FIG. 6 is a block diagram of the dual port memory device of FIG. 5. Referring to FIG. 6, the dual port memory device comprises a memory M, an address buffer 2, a random data buffer 5, and a serial data buffer 9, in addition to the connection pins of FIG. 5. Memory M comprises a memory cell array 1 having a plurality of memory cells arranged in the row direction and the column direction, a row decoder 3, a column decoder 4, an address pointer 6, a data register 7, a serial data selector 8, and a clock generator 10. Random data buffer 5, random data input/output terminals $W_0/IO_0$–$W_3/IO_3$ implement a random data input/output port W/IO. Serial data buffer 9 and serial data input/output terminals $SIO_0$–$SIO_3$ implement a serial data input/output port SIO. Clock generator 10 responds to various externally applied control signals via a relevant control terminal to generate an internal control signal for controlling the internal circuit. The internal signal is denoted a reference character identical to an externally applied control signal.

Address buffer 2, row decoder 3, column decoder 4, and data buffer 5 are circuits similar to those used in a typical dynamic RAM to carry out random access control. Address pointer 6, data register 7, serial data selector 8, and serial data buffer 9 are circuits for carrying out serial access control.

FIG. 7 is a timing chart of the dual port memory device of FIG. 6. Row address strobe signal $\overline{RAS}$, column address strobe signal $\overline{CAS}$, and random data W/IO are in asynchronization with clock signal SC and serial data SIO. Random access control and serial access control will be explained with reference to FIGS. 6 and 7.

Random access control is carried out as follows. Row decoder 3 responds to row address strobe signal $\overline{RAS}$ to strobe a row address signal (refer to FIG. 7(1)). Then, column decoder 4 responds to column address strobe signal $\overline{CAS}$ to strobe a column address signal (refer to FIG. 7(2)). The strobed row address signal and column address signal are decoded by row decoder 3 and column decoder 4, respectively, and then provided to memory cell array 1. If write enable signal $\overline{WE}$ and data $W_0$–$W_3$ are applied at this time, data $W_0$–$W_3$ are read into memory cells of 4 bits of memory cell array 1 (refer to FIG. 7(3)). Conversely, if read enable signal $\overline{OE}$ is applied, data $IO_0$–$IO_3$ are read out from the memory cells of 4 bits of memory cell array 1 (refer to FIG. 7(3)). The readout data are provided from random data input/output port W/IO.

Serial access control is carried out as follows. By address signals $A_0$–$A_7$, row address strobe signal $\overline{RAS}$, column address strobe signal $\overline{CAS}$, and control signal $\overline{DT}/\overline{OE}$, data stored in the memory cells of 4 bits are transferred to data register 7. At this time, the column address strobed by column address strobe signal $\overline{CAS}$ is loaded to address pointer 6. The bits (4 bits) specified by the loaded row address are selected by serial data selector 8. The selected 4 bits of data are provided to serial data input/output terminals SIO via serial data buffer 9. Then, address pointer 6 is incremented by 1 point (refer to FIG. 7(4)) every time clock signal SC attains a H level (logical high). This causes the contents of data register 7 to be provided sequentially 1 bit at a time. Thus, the data stored in memory cells of 4 bits in memory cell array 1 are provided to serial data input/output port SIO (refer to FIG. 7(5)). Writing data from serial data input/output port SIO is carried out by an operation in a manner conversely of the reading operation. That is to say, the contents of the serial data input/output port is written sequentially into data register 7 every time clock signal SC attains an H level. Lastly, $A_0$–$A_7$, $\overline{RAS}$, $\overline{CAS}$, $\overline{DT}/\overline{OE}$ control the timing of writing to memory cell array 1.

Thus, the dual port memory can carry out random access and serial access in an asynchronous manner. The inventor of the present invention noticed that noise "a" of FIG. 7(3) is included in the random data at the rise of clock signal SC. This noise "a" may induce erroneous operation of the device that receives data from the dual port memory device. The cause of this noise "a" generation will be explained with reference to FIGS. 8 and 9.

FIG. 8 is a device diagram showing the arrangement of a dual port memory and the power supply wiring. Referring to FIG. 8, this device comprises a semiconductor substrate 20, a memory M, and power supply wirings 21a, 21b. Power supply wirings 21a and 21b are provided in parallel with each other between the inner periphery of semiconductor substrate 20 and the outer periphery of memory M. Between power supply wirings 21a and 21b, random data input/output port W/IO, serial data input/output port SIO, control terminals, power supply terminals $V_{SS}$ and $V_{CC}$, address buffer 2, and input buffer 10a of clock generator 10 are provided.

Power supply wiring 21a is connected to power supply terminal $V_{CC}$, and power supply wiring 21b is connected to power supply terminal $V_{SS}$. Address buffer 2, random data buffer 5, and serial data buffer 9 receive power supply voltage from power supply wirings 21a and 21b.

A conventional dual port memory device has random data input/output terminals W/IO and serial data input/output terminals SIO mixed both in the right and left directions of power supply terminal $V_{SS}$. This means that when clock signal SC attains a H level every time the data provided from random data input/output terminal W/IO is at a L level, the charge in serial data input/output terminal SIO is discharged towards power supply wiring 21a via serial data buffer 9. This discharge current generates voltage by the resistance component of power supply wiring 21a, whereby noise "a" appears in random data input/output port W/IO.

FIG. 9 is a partial enlarged diagram of FIG. 8. Since noise "a" is generated when random data and serial data are output, only the output systems of buffers 5 and 9 will be illustrated, with terminals SIO₃ and W₃/IO₃. Referring to FIG. 9, random data buffer 5 comprises an inverter 5a, an NOR gate 5b, an NOR gate 5c, an NMOS transistor 5d, and an NMOS transistor 5e. Random data buffer 5 provides data read out from memory M as follows. Inverter 5a inverts data read out from memory M. NOR gate 5b receives data read out from memory M and control signal $\overline{DT/OE}$ to control MOS transistor 5d. NOR gate 5e receives the data inverted by inverter 5a and control signal $\overline{DT/OE}$ to control NMOS transistor 5e. NMOS transistor 5d and NMOS transistor 5c are switched complementary to provide the data read out from memory M to random data input/output terminal W₃/IO₃.

Serial data buffer 9 comprises an inverter 9a, an NOR gate 9b, an NOR gate 9c, an NMOS transistor 9d, and an NMOS transistor 9e. Serial data buffer 9 provides data read out from memory M in series as follows. The data read out from memory M every time clock signal SC attains an H level is inverted by inverter 9a. NOR gate 9b receives the data read out from memory M and control signal $\overline{SE}$ to control NMOS transistor 9d. NOR gate 9c receives the data inverted by inverter 9a and control signal $\overline{SE}$ to control NMOS transistor 9e. NMOS transistor 9d and NMOS transistor 9e are switched in a complementary manner to provide data read out from memory M to serial data input/output terminal SIO₃.

When NMOS transistor 9e is turned on, charge stored in serial data input/output terminal SIO₃ flows towards power supply terminal $V_{SS}$ via power supply wiring 21a (refer to solid line arrow of FIG. 9). This results in the generation of a voltage depending upon the discharge current and resistance component of power supply wiring 21a. If NMOS transistor 5e is at the ON state when this voltage is generated, the generated voltage noise "a" appears on random data input/output terminal W₃/IO₃.

As described above, noise is generated in the data of the random data input/output terminal in the case where serial data is inverted to a L level when an L level signal is provided from random data input/output terminal in a conventional dual port memory device. To solve this problem, approaches to enlarge the width of the power supply wiring, or to provide separate power supply wirings exclusively for serial access and random access are considered. However, enlargement in the width of the power supply wiring or the increase of the numbers of power supply wirings are not desirable because it will enlarge the area of the semiconductor chip.

SUMMARY OF THE INVENTION

An object of the present invention is to prevent discharge noise generated at the time of serial access from appearing in the data provided by random access in a dual port memory.

Another object of the present invention is to prevent noise generated at the time of serial access from appearing in the data provided by random access in a dual port memory without enlarging the chip area.

Briefly, a dual port memory device according to the present invention includes a semiconductor substrate, a memory cell array formed on the main surface of the semiconductor substrate, a random access device, and a serial access device. The memory cell array includes a plurality of memory cells. The random access device is capable of accessing in random a plurality of memory cells. The serial access device is capable of accessing in series a plurality of memory cells. The dual port memory device further includes a, power supply terminal, a power supply wiring, a random data input/output port, and a serial data input/output port.

The power supply terminals are applied with power supply voltage.

The power supply wiring is provided extending in one direction and the other direction with respect to the power supply terminal.

The random data input/output port is connected to a power supply wiring provided in one direction to receive input/output data by random access.

The serial data input/output port is connected to a power supply wiring provided in the other direction to receive input/output data by serial access.

In operation, the random data input/output port is formed in one direction with respect to the power supply terminal, and the random data input/output port is formed in the other direction with respect to the power supply terminal. In the case a serial data is inverted when data is provided from the random data input/output port, the output inversion causes current due to discharge to flow towards the power supply terminal from the serial data input/output port through the power supply wiring. This current flows to an external source through the power supply terminal before flowing to the random data input/output port. This prevents, discharge current from flowing to the random data input/output port provided in the other direction with respect to the power supply terminal. The data provided from random data input/output port does not include noise due to discharge current.

Therefore, it is possible to prevent noise occurring with serial access from being included in the data provided by random access. There is also an advantage that the integration density is not lowered since it is not necessary to enlarge the width of a power supply wiring and increase the number of power supply wirings for noise suppress.

The foregoing and other objects, features, aspects and advantages of the present invention will become more apparent from the following detailed description of the present invention when taken in conjunction with the accompanying drawings.

BRIEF DESCRIPTION OF THE PREFERRED EMBODIMENTS

Figure 1:
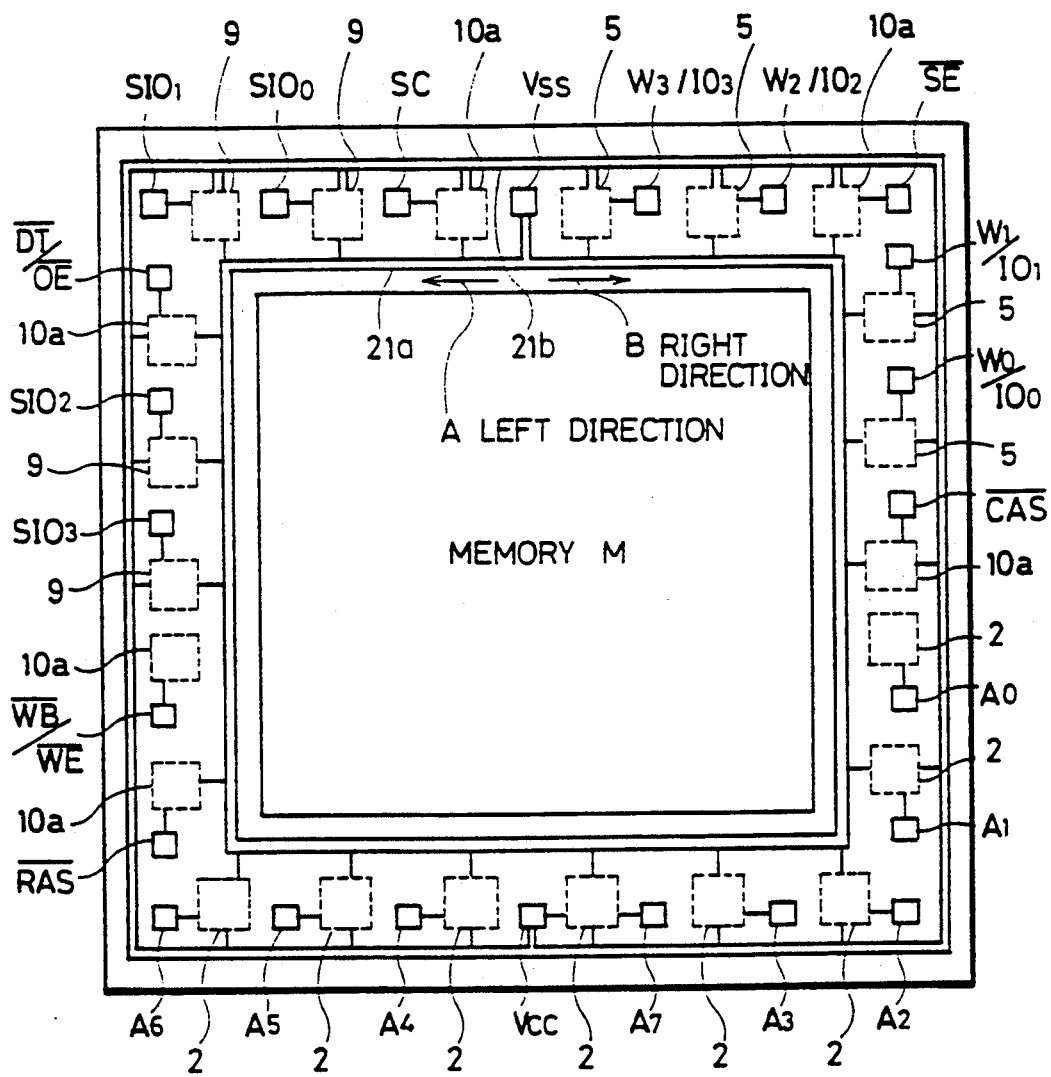
FIG. 1 is an arrangement diagram of pads and power supply wirings showing an embodiment of the present invention.

FIG. 1 is an arrangement diagram of pads showing an embodiment of a dual port memory device of the present invention.

Figure 8:
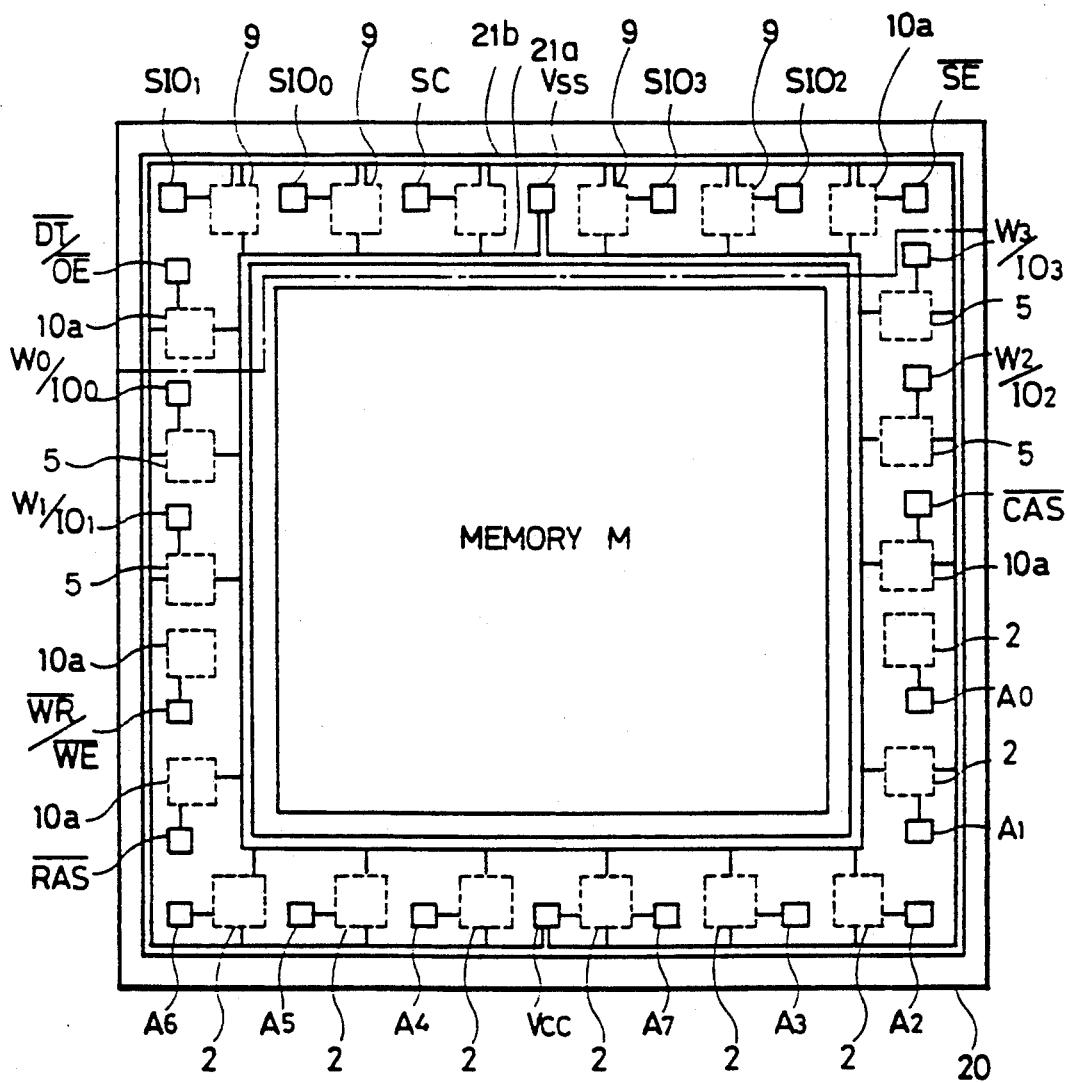
FIG. 8 is an arrangement diagram of pads and power supply wirings showing the internal structure of FIG. 5.

Referring to FIG. 1, this dual port memory device differs from that of FIG. 8 in that serial data input/output port SIO is provided in the left direction as shown by arrow A with respect to power supply terminal $V_{SS}$, and random data input/output port W/IO is arranged in the right direction with respect to power supply terminal $V_{SS}$, as shown by arrow B. The serial data input/output port SIO and the random data input/output port W/IO are separated from each other with respect to power supply terminal $V_{SS}$.

This arrangement prevents the discharge current from flowing to power supply wiring 21a at the right side of power supply terminal $V_{SS}$, since the discharge current generated at the time of serial data $SIO_0$–$SIO_3$ inverting their levels is absorbed through a path formed of power supply wiring 21a and power supply terminal $V_{SS}$. As a result, data provided from random data input/output port W/IO does not include noise.

Figure 2:
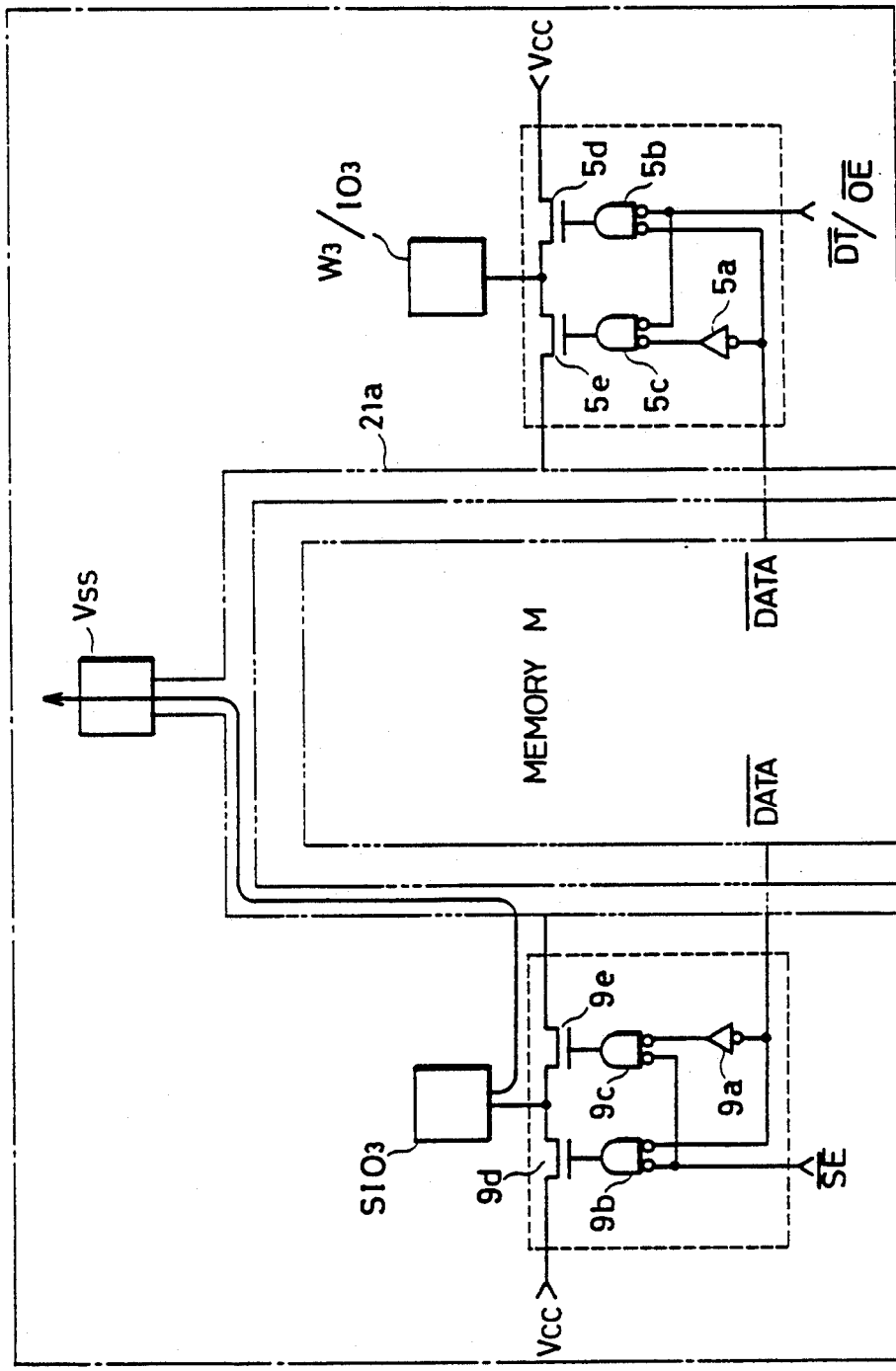
FIG. 2 is an enlarged diagram of a portion of FIG. 1.
Figure 9:
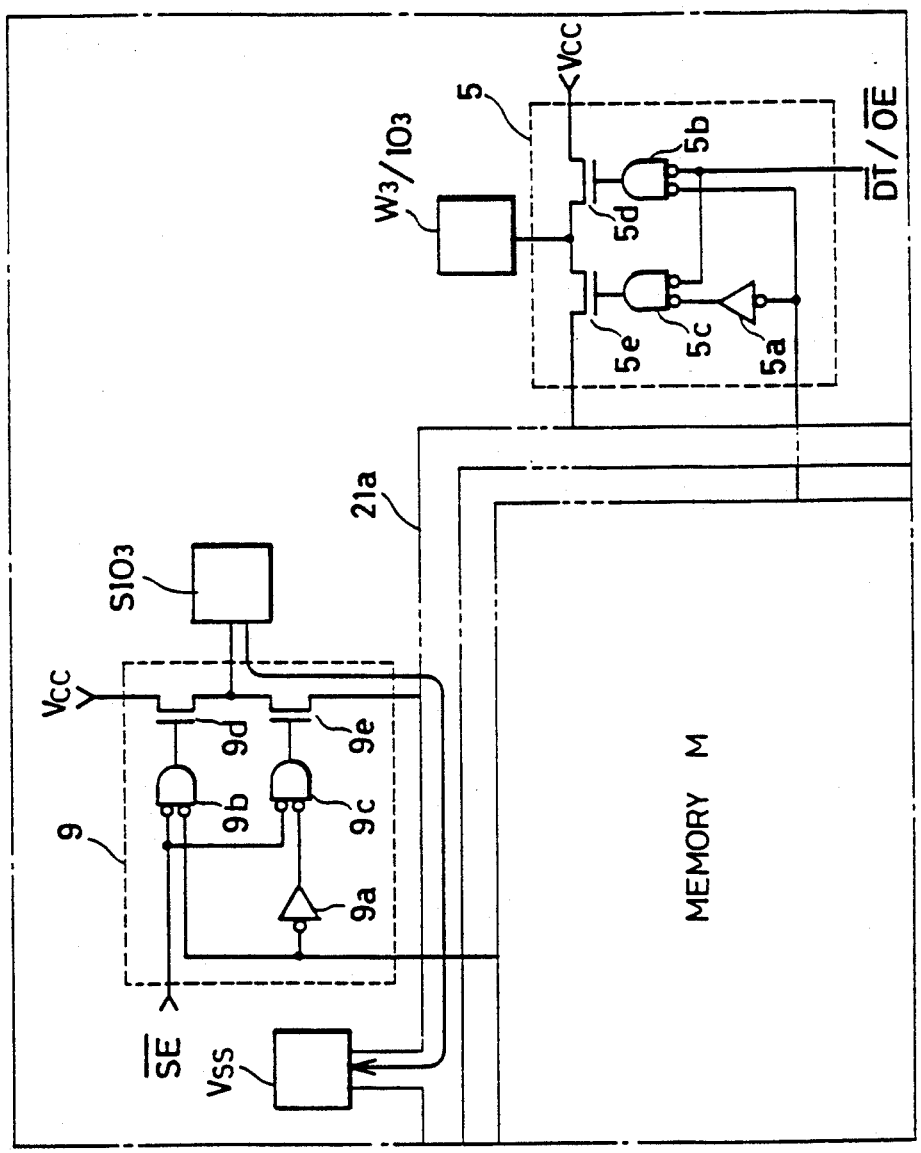
FIG. 9 is an enlarged diagram of a portion of FIG. 8.

FIG. 2 is an enlarged view of a portion of the dual port memory of FIG. 1. Referring to FIG. 2, the dual port memory device of FIG. 2 differs from that of FIG. 9 in that serial data input/output terminal $SIO_3$ is provided at the left side of power supply terminal $V_{SS}$.

As described in the embodiment of a conventional case, charge is discharged from serial data input/output terminal $SIO_3$ every time a serial data provided when clock signal SC attains an H level has the output level inverted to a L level. The discharge current flows across the source and drain of NMOS transistor 9e, and then outside through power supply wiring 21a and power supply terminal $V_{SS}$.

Discharge current does not flow to random data input/output terminal $W_3/IO_3$ provided at the right side of power supply terminal $V_{SS}$ so that noise does not appear in the random data input/output terminal $W_3/IO_3$ of an L level. Therefore, the data stored in memory M can be provided accurately from the random data input/output terminal.

Figure 3:
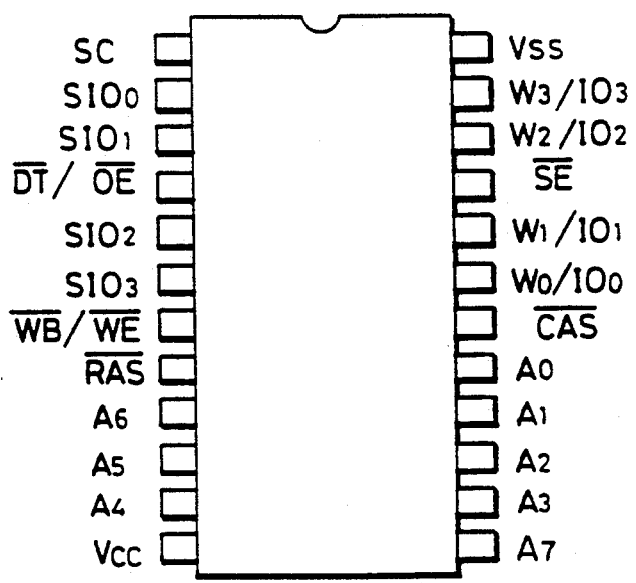
FIG. 3 is an arrangement diagram of pins molding the device of FIG. 1.

FIG. 3 shows the memory device of FIG. 1 in a mold state. Referring to FIG. 3, the pins of this dual port memory are arranged sequentially corresponding to the pad arrangement of FIG. 1. Therefore, the lines bonded between the pins and the terminals will not cross.

Figure 4:
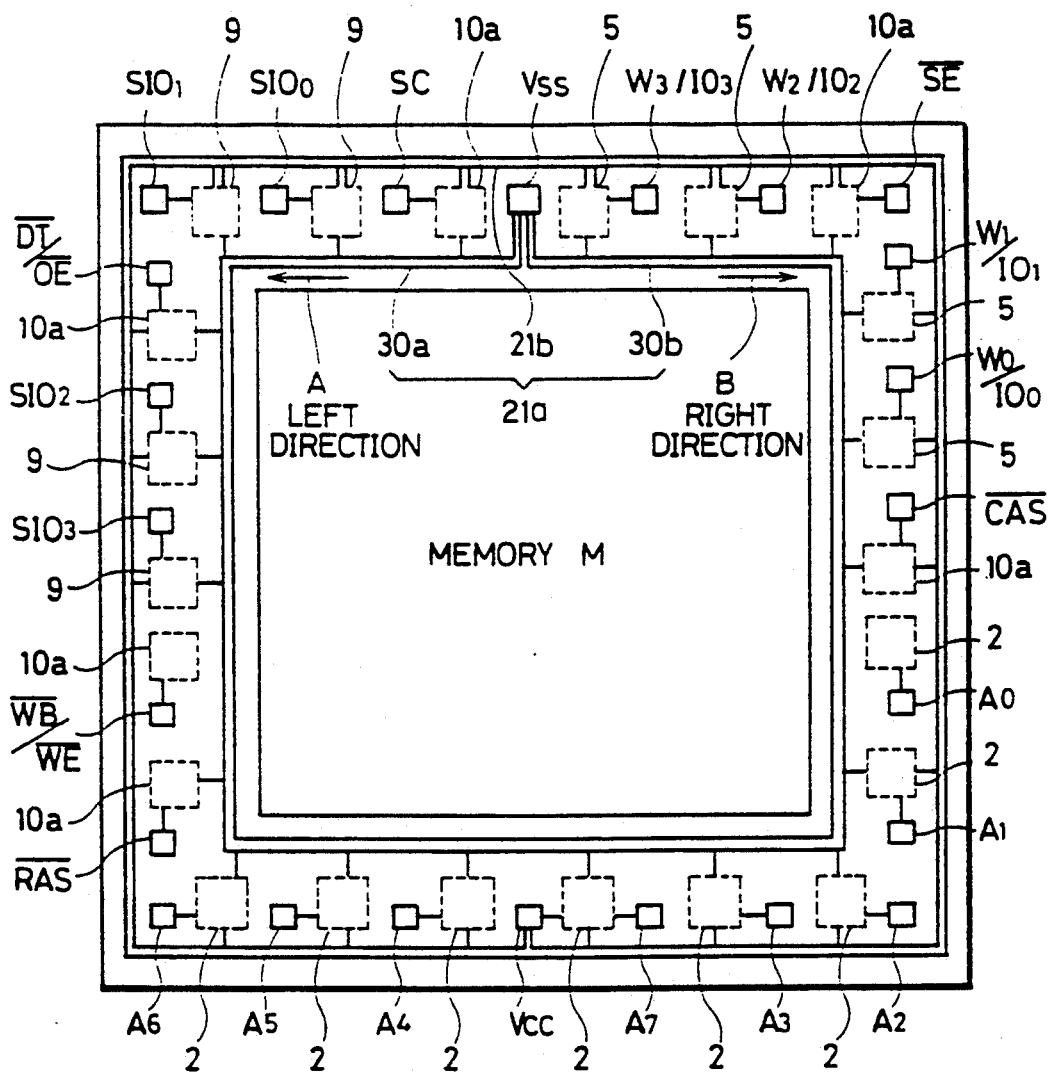
FIG. 4 is a diagram showing another embodiment of FIG. 1.
Figure 5:
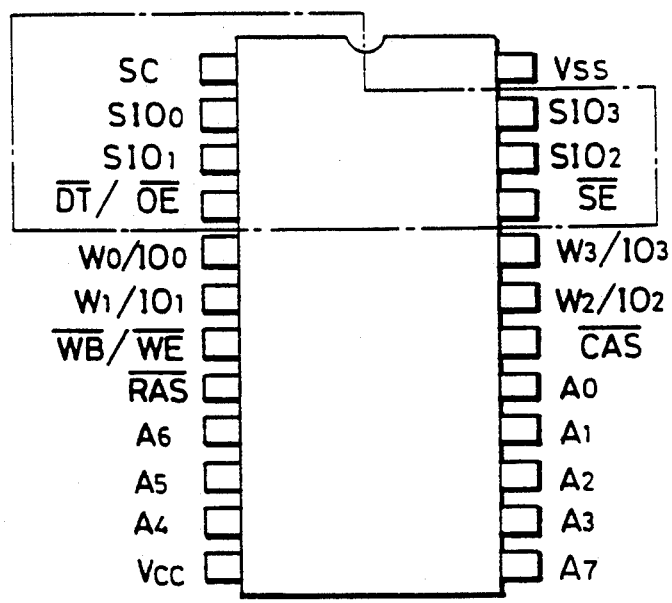
FIG. 5 is a diagram of pin arrangements of a conventional dual port memory device.
Figure 6:
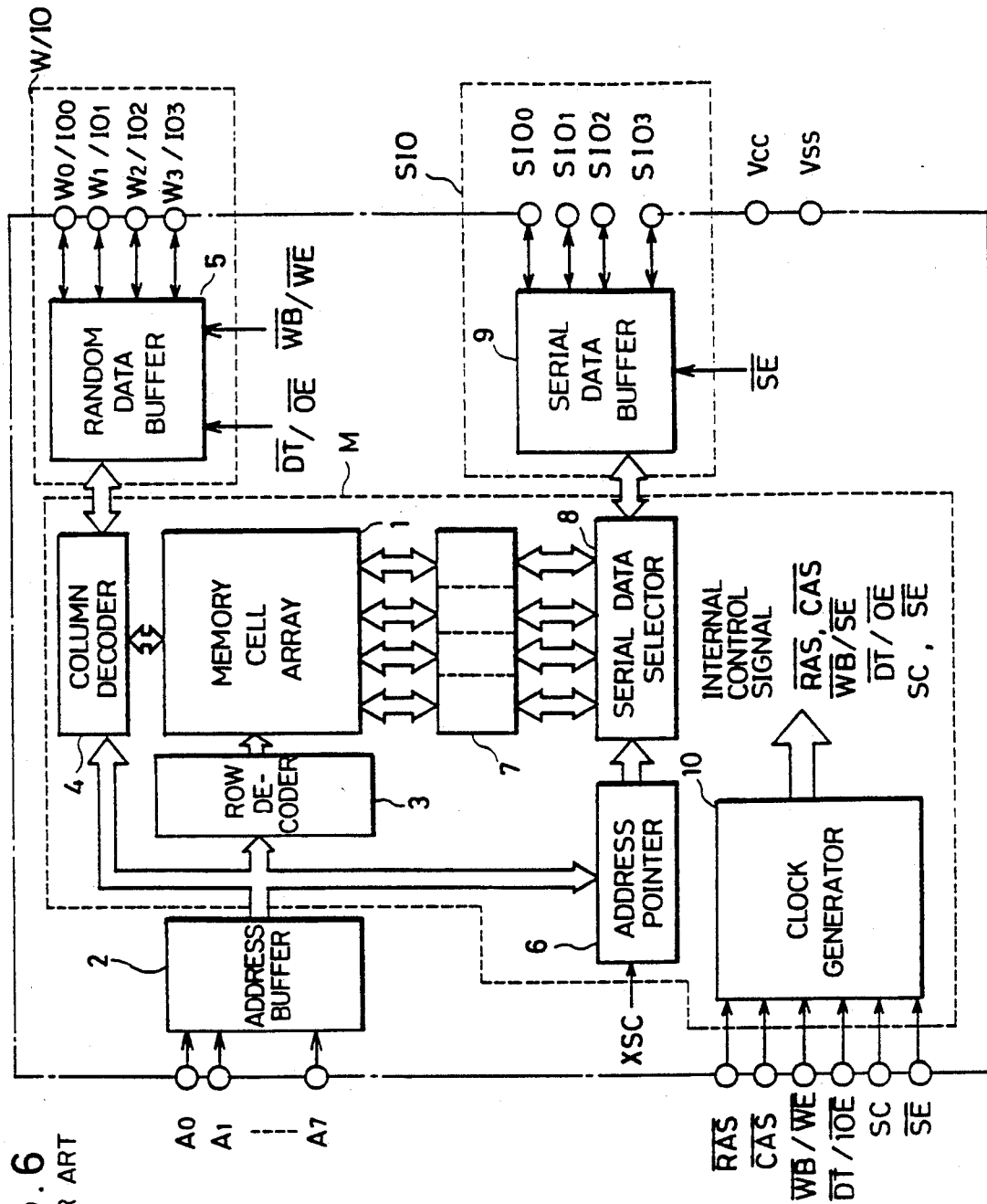
FIG. 6 is a block diagram of a dual port memory device of FIG. 5.
Figure 7:
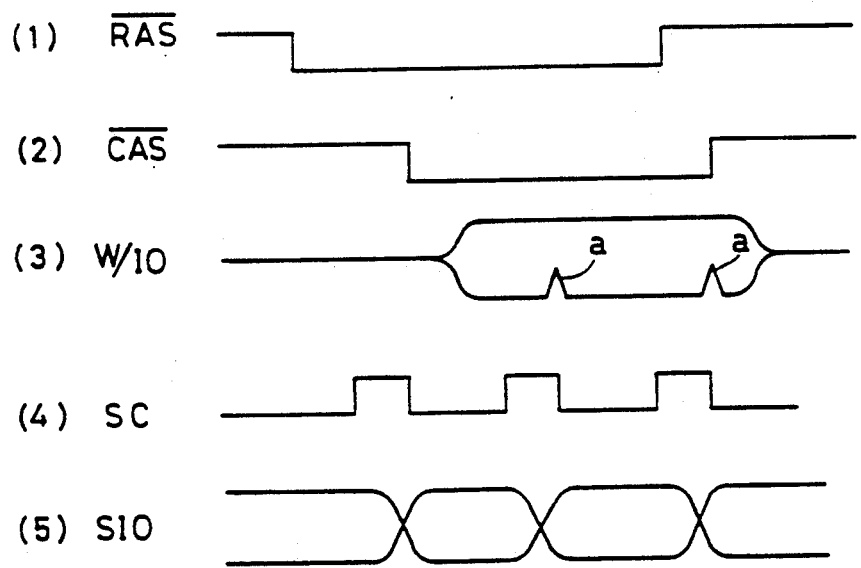
FIG. 7 is a timing chart of a dual port memory device of FIG. 6.

FIG. 4 is a diagram of a dual port memory device of FIG. 1 according to another embodiment. Referring to FIG. 4, this dual port memory device differs from that of FIG. 1 in that power supply wiring 21a is separated into a left side wiring 30a and a right side wiring 30b with respect to power supply terminal $V_{SS}$. This separation allows an effect to be obtained similar to that of the embodiment of FIG. 1.

Although the embodiments of FIGS. 1–4 described a dual port memory that can input/output serial data, the present invention is applicable to a dual port memory device that provides serial data and random data asynchronously. For example, the present invention can be applied to a dual port memory device that does not write serial data into memory M, and only provides serial data.

Although the present invention has been described and illustrated in detail, it is clearly understood that the same is by way of illustration and example only and is not to be taken by way of limitation, the spirit and scope of the present invention being limited, only by the terms of the appended claims.

What is claimed is:

1. A dual port memory device including a substantially rectangular semiconductor substrate, a memory cell array having a plurality of memory cells, a random access device that can access in random said plurality of memory cells, and a serial access device that can access in series said plurality of memory cells, said dual port memory device comprising:

a first power supply terminal to receive a first power supply voltage and positioned proximate a first side of said semiconductor substrate;

a second power supply terminal to receive a second power supply voltage and positioned proximate a second side of said semiconductor substrate, opposite said first side;

a first power supply wiring circumscribing an outer periphery of said memory cell array and connected to said first power supply terminal;

a plurality of random data input/output terminals for receiving input/output data by said random access, and a plurality of random data input/output buffers provided corresponding to said plurality of random data input/output terminals; and a plurality of serial data input/output terminals for receiving input/output data by said serial access, and a plurality of serial data input/output buffers provided corresponding to said plurality of serial data input/output terminals; wherein said memory device is capable of data input/output of a unit of a plurality of bits through said plurality of random data input/output terminals and said plurality of serial data input/output terminals, said semiconductor substrate has first and second surface regions defined by a line passing through said first and second power supply terminals, wherein said first and second surface regions are mutually exclusive with respect to the line;

all said plurality of random data input/output buffers are connected to said first power supply wiring in said first surface region, and all said plurality of serial data input/output buffers are connected to said first power supply wiring in said second surface region.

2. The dual port memory device according to claim 1, wherein said first and second power supply terminals, said first power supply wiring, said plurality of random data input/output terminals, and said plurality of serial data input/output terminals are provided between an inner periphery of said semiconductor substrate and the outer periphery of said memory cell array.

3. The dual port memory device according to claim 2, further comprising a second power supply wiring circumscribing the inner periphery of said semiconductor substrate, outside said first power supply wiring, and connected to said second power supply terminals.

4. The dual port memory device according to claim 3, wherein said plurality of random data input/output terminals and said plurality of serial data input/output terminals are provided between said first and second power supply wirings.

* * * * *